US012702032B2

(12) United States Patent
Shin et al.

(10) Patent No.: US 12,702,032 B2
(45) Date of Patent: Aug. 4, 2026

(54) SEMICONDUCTOR PACKAGE AND DISPLAY APPARATUS INCLUDING THE SAME

(71) Applicant: Samsung Electronics Co., Ltd., Suwon-si (KR)

(72) Inventors: Narae Shin, Suwon-si (KR); Seongho Shin, Suwon-si (KR); Seonghwan Jeon, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 617 days.

(21) Appl. No.: 18/125,409

(22) Filed: Mar. 23, 2023

(65) Prior Publication Data

US 2023/0420349 A1 Dec. 28, 2023

(30) Foreign Application Priority Data

Jun. 23, 2022 (KR) ........................ 10-2022-0077107

(51) Int. Cl.
| | |
|---|---|
| *H10W 70/685* | (2026.01) |
| *H10W 70/63* | (2026.01) |
| *H10W 70/67* | (2026.01) |
| *H10W 74/10* | (2026.01) |
| *H10W 90/00* | (2026.01) |

(52) U.S. Cl.
CPC ....... *H10W 70/685* (2026.01); *H10W 70/635* (2026.01); *H10W 70/688* (2026.01); *H10W 74/111* (2026.01); *H10W 90/724* (2026.01)

(58) Field of Classification Search
CPC ......... H01L 21/76895; H01L 21/76816; H01L 21/7685; H01L 23/15; H01L 23/528; H05K 1/111; H05K 7/20254; H05K 7/20409; H10W 70/685; H10W 70/635; H10W 70/688; H10W 74/111; H10W 90/724
See application file for complete search history.

(56) References Cited

U.S. PATENT DOCUMENTS

| | | | |
|---|---|---|---|
| 7,420,270 B2 | 9/2008 | Lee et al. |
| 7,445,968 B2 | 11/2008 | Harrison et al. |
| 8,847,184 B2 | 9/2014 | Cheng et al. |

(Continued)

FOREIGN PATENT DOCUMENTS

| | | |
|---|---|---|
| JP | 2012160728 A | 8/2012 |

*Primary Examiner* — Benjamin Tzu-Hung Liu
(74) *Attorney, Agent, or Firm* — Muir Patent Law, PLLC

(57) ABSTRACT

A semiconductor package includes a base film, a first conductive structure disposed on a first surface of the base film, a second conductive structure disposed on a second surface of the base film, a via passing through the base film and connecting the first conductive structure to the second conductive structure, a semiconductor chip on the first surface and electrically connected to the first conductive structure, a first insulating layer covering the first conductive structure and including a first opening exposing a first conductive pattern of the first conductive structure, a first conductive layer disposed on the first insulating layer, covering the first insulating layer and the semiconductor chip, and contacting a region of the first conductive pattern exposed by the first opening, and a second conductive layer disposed on the second surface, covering the second conductive structure, and contacting at least a portion of the second conductive structure.

20 Claims, 9 Drawing Sheets

10

(56)  References Cited

U.S. PATENT DOCUMENTS

| | | | | |
|---|---|---|---|---|
| 9,713,255 | B2 | 7/2017 | Elsherbini et al. | |
| 2007/0096293 | A1* | 5/2007 | Wen | H10W 74/111 |
| | | | | 257/E23.101 |
| 2011/0304991 | A1* | 12/2011 | Huang | B82Y 10/00 |
| | | | | 977/734 |
| 2016/0148881 | A1 | 5/2016 | Park et al. | |
| 2018/0331049 | A1 | 11/2018 | Huang et al. | |
| 2019/0122943 | A1* | 4/2019 | Lim | H01L 24/09 |
| 2020/0035644 | A1 | 1/2020 | Choi et al. | |
| 2020/0211973 | A1* | 7/2020 | Jung | H01L 23/3675 |
| 2021/0105890 | A1 | 4/2021 | Powney et al. | |

* cited by examiner

10

10a

SEMICONDUCTOR PACKAGE AND DISPLAY APPARATUS INCLUDING THE SAME

CROSS-REFERENCE TO RELATED APPLICATION(S)

This application claims benefit of priority to Korean Patent Application No. 10-2022-0077107 filed on Jun. 23, 2022 in the Korean Intellectual Property Office, the disclosure of which is herein incorporated by reference in its entirety.

BACKGROUND

The present inventive concept relates to a semiconductor package and a display apparatus including the same.

In a chip-on-film (COF) package, a semiconductor chip may be mounted on a base film, and the mounted semiconductor chip may be electrically connected to an external device through a conductive structure on the base film. With the recent miniaturization of bezels and thinning of panels in display apparatuses, a technology for controlling temperature of a semiconductor chip mounted in a COP package and reducing electromagnetic interference (EMI) caused by electromagnetic waves is desirable.

SUMMARY

An aspect of the present inventive concept is to provide a semiconductor package having improved heat dissipation characteristics and electrical characteristics.

An aspect of the present inventive concept is to provide a display apparatus having improved heat dissipation characteristics and electrical characteristics.

According to an aspect of the present inventive concept, a semiconductor package includes a base film having a first surface and a second surface opposite each other; a first conductive structure disposed on the first surface of the base film; a second conductive structure disposed on the second surface of the base film; a via passing through the base film and connecting the first conductive structure to the second conductive structure; a semiconductor chip on the first surface of the base film and electrically connected to the first conductive structure; a first insulating layer covering the first conductive structure on the first surface of the base film and including a first opening exposing a first conductive pattern of the first conductive structure; a first conductive layer disposed on the first insulating layer and covering the first insulating layer and the semiconductor chip, wherein the first conductive layer contacts a region of the first conductive pattern exposed by the first opening; and a second conductive layer disposed on the second surface of the base film and covering the second conductive structure, wherein a portion of the second conductive layer contacts at least a portion of the second conductive structure.

According to an aspect of the present inventive concept, a semiconductor package includes: a base film having a first surface and a second surface opposing each other; a first conductive structure disposed on the first surface of the base film and including first conductive lines and first conductive patterns electrically connected to the first conductive lines, respectively; a semiconductor chip mounted on the first surface of the base film and electrically connected to the first conductive lines; a second conductive structure disposed on the second surface of the base film; a via passing through the base film and electrically connecting the first conductive structure to the second conductive structure; a first conductive layer disposed on the first conductive structure and contacting the first conductive patterns; and a second conductive layer disposed on the second conductive structure and contacting at least a portion of the second conductive structure.

According to an aspect of the present inventive concept, a semiconductor package includes: a base film having a first surface on which a semiconductor chip is mounted, and a second surface opposite the first surface; pads disposed on the first surface of the base film and including at least one ground pad, at least one power pad, and signal pads; a first wiring line disposed on the first surface of the base film and including a first end portion electrically connected to the at least one ground pad or the at least one power pad and a second end portion electrically connected to the semiconductor chip; a first conductive pattern extending from the first wiring line; a first insulating layer covering the first wiring line and exposing the first conductive pattern; a first conductive layer disposed on the first insulating layer and covering the semiconductor chip, wherein the first conductive layer contacts the first conductive pattern; a second conductive pattern disposed on the second surface of the base film and electrically connected to the first conductive pattern; and a second conductive layer contacting the second conductive pattern.

BRIEF DESCRIPTION OF DRAWINGS

The above and other aspects, features, and advantages of the present inventive concept will be more clearly understood from the following detailed description, taken in conjunction with the accompanying drawings, in which.

DETAILED DESCRIPTION

Hereinafter, example embodiments of the present inventive concept will be described with reference to the accompanying drawings.

A semiconductor package 10 according to example embodiments will be described with reference to FIGS. 1 to 3.

Figure 1:
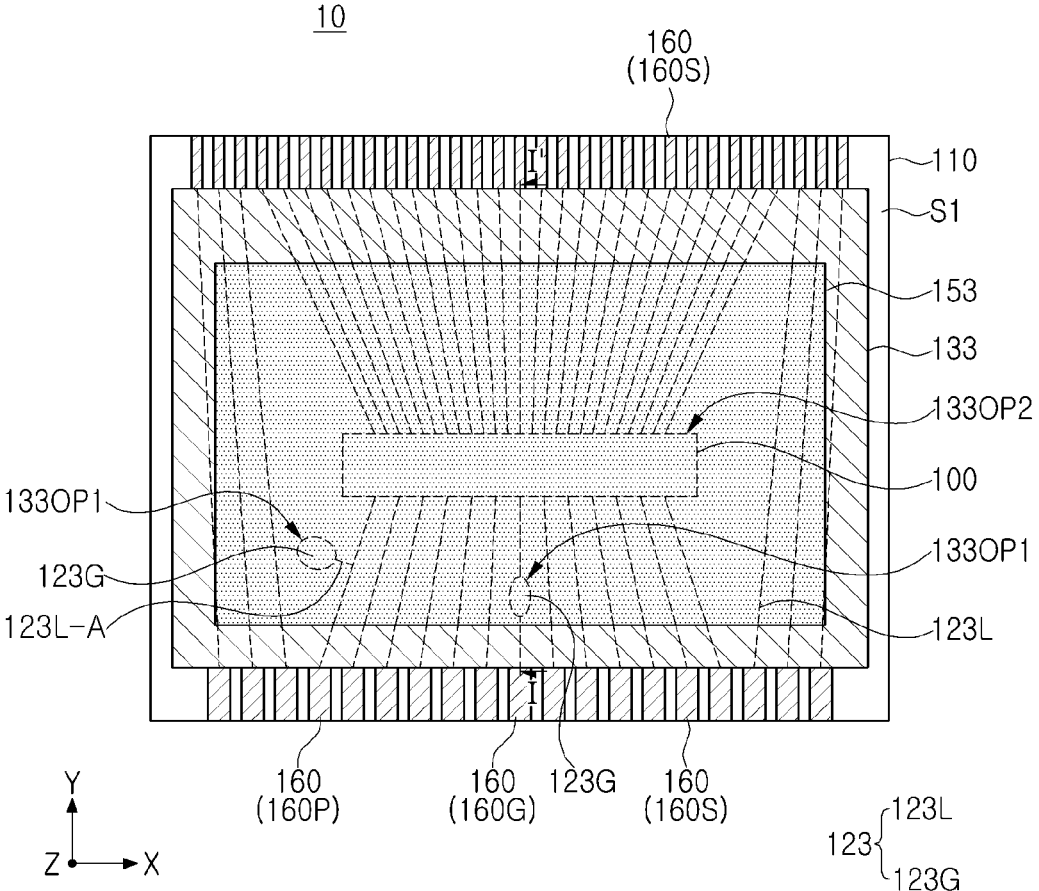
FIG. 1 is a schematic top layout view of a semiconductor package according to example embodiments.
Figure 2:
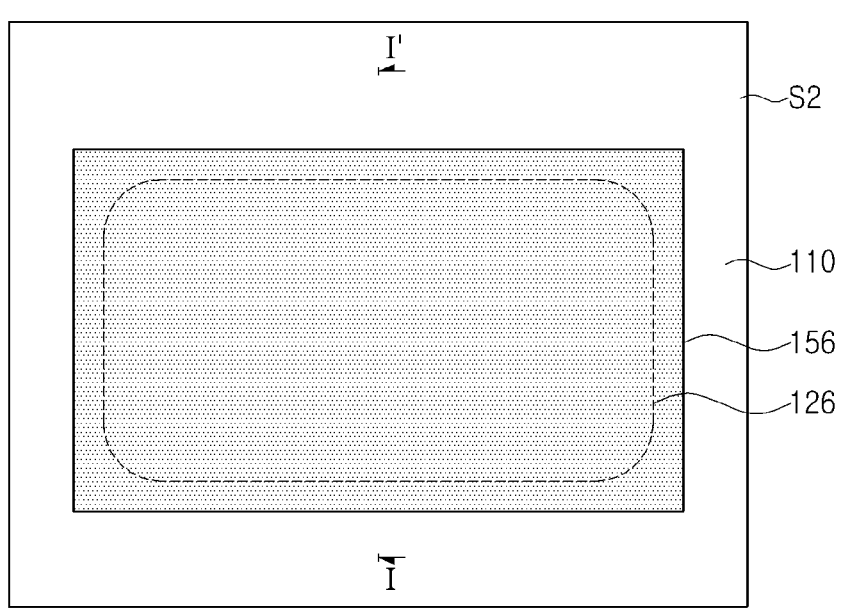
FIG. 2 is a schematic bottom layout view of a semiconductor package according to example embodiments.
Figure 2:
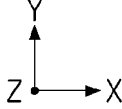
Figure 3:
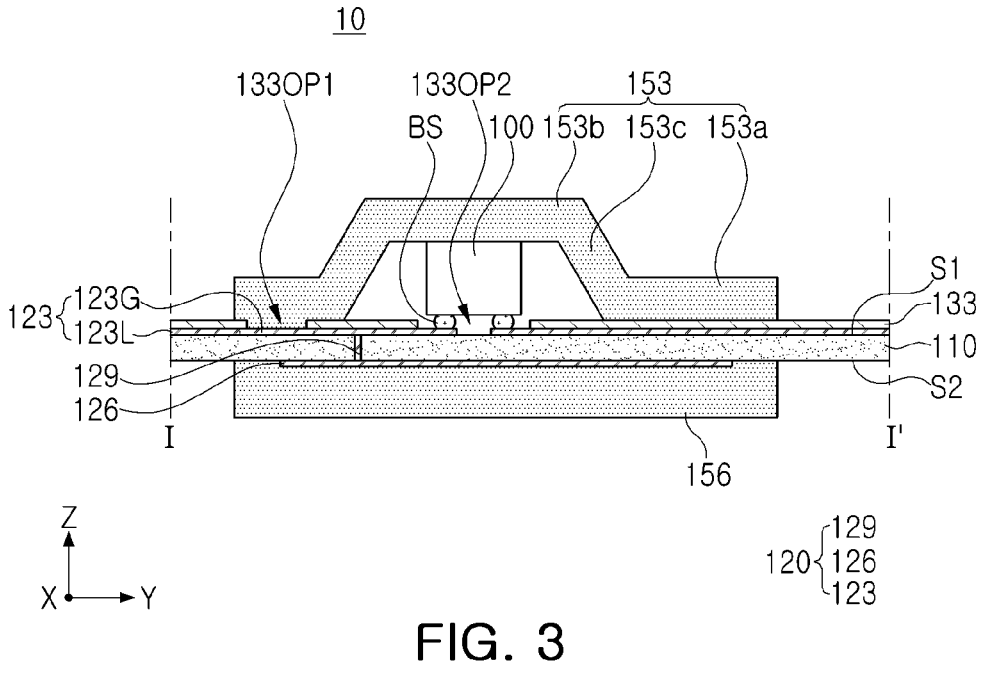
FIG. 3 is a schematic cross-sectional view of a semiconductor package according to example embodiments.

FIG. 1 is a schematic top layout view of the semiconductor package 10 according to example embodiments, FIG. 2 is a schematic bottom layout view of the semiconductor package 10 according to example embodiments, and FIG. 3 is a schematic cross-sectional view of the semiconductor package 10 according to example embodiments. FIG. 3 is a cross-sectional view taken along line I-I' of FIGS. 1 and 2.

Referring to FIGS. 1 through 3, the semiconductor package 10 may include a semiconductor chip 100, a base film 110, a conductive structure 120, a first insulating layer 133, and first and second capping layers 153 and 156. The semiconductor package 10 may be, for example, a chip-on-film (COF) semiconductor package.

The semiconductor chip 100 may be disposed in a circuit region of the base film 110, in particular, a chip mounting region. The semiconductor chip 100 may be a driving chip used to drive an apparatus. When the semiconductor package 10 is coupled to, for example, a display apparatus, the semiconductor chip 100 may be a display driving chip used to drive the display apparatus. In example embodiments, the semiconductor chip 100 may be a source driving chip generating an image signal using a data signal transmitted from a timing controller and outputting the image signal to a display panel. In other embodiments, the semiconductor chip 100 may be a gate driving chip outputting a scan signal including an ON/OFF signal of a transistor to the display panel. However, the type of the semiconductor chip 100 is not limited thereto. When the semiconductor package 10 is coupled to an apparatus other than the display apparatus, the semiconductor chip 100 may be a chip for driving the corresponding electronic apparatus.

FIGS. 1 to 3 illustrate an embodiment in which the semiconductor package 10 includes one semiconductor chip 100, but the number of semiconductor chips 100 is not limited thereto. In some embodiments, the semiconductor package 10 may include two or more semiconductor chips.

The semiconductor chip 100 may include a substrate. The substrate is a semiconductor substrate and may have an active surface and an inactive surface opposite each other. In example embodiments, the substrate may be a silicon (Si) wafer including crystalline silicon, polycrystalline silicon, or amorphous silicon. In other embodiments, the substrate may include or may be formed of a semiconductor element, such as germanium (Ge), or a compound semiconductor, such as silicon carbide (SiC), gallium arsenide (GaAs), indium arsenide (InAs), and indium phosphide (InP).

The base film 110 may be a flexible film. The base film 110 may be an insulating film. In example embodiments, the base film 110 may include or may be formed of resins, such as polyimide (PI), polyamide (AD), polyethylene terephthalate (PET), polyethylene naphthalate (PEN), polyethersulphone (PES), polyacrylate (PAR), polyetherimide (PEI), polyphenylene sulfide (PPS), polyallylate, polycarbonate (PC), cellulose triacetate (TAC), and cellulose acetate propionate (CAP).

The base film 110 may include a first surface S1 on which the semiconductor chip 100 is mounted and a second surface S2 opposite to the first surface S1.

The conductive structure 120 may include a first conductive structure 123 disposed on the first surface S1 of the base film 110, a second conductive structure 126 disposed on the second surface S2 of the base film 110, and a via 129 passing through the base film 110.

Referring to FIGS. 1 and 3, the first conductive structure 123 may include first conductive lines 123L and first conductive patterns 123G connected to the first conductive lines 123L. The first conductive lines 123L may be leads electrically connecting the semiconductor chip 100 to the pads 160. For example, one end portions of the first conductive lines 123L may be connected to the semiconductor chip 100, and other end portions of the first conductive lines 123L may be connected to the pads 160. One end portions of the first conductive lines 123L may be connected to bumps BS disposed below the semiconductor chip 100, respectively. The other end portions of the first conductive lines 123L may correspond to the pads 160, respectively, and may be electrically connected thereto. In some embodiments, the semiconductor chip 100 may include the bumps BS.

The first conductive patterns 123G may extend from the first conductive lines 123L. The first conductive patterns 123G may have, for example, a larger width or a larger region than that of the first conductive lines 123L. In FIG. 1, the first conductive patterns 123G are illustrated as having a circular or oval shape, but the shapes of the first conductive patterns 123G are not limited thereto. Also, although FIG. 1 illustrates that the semiconductor package 10 has two first conductive patterns 123G for convenience of description, the present inventive concept is not limited thereto. The semiconductor package 10 may include a single or three or more first conductive patterns 123G. In some embodiments, the first conductive lines 123L may include conductive lines connected to the first conductive patterns 123G, respectively, and conductive lines that are not connected to the first conductive patterns 123G. In some embodiments, the conductive lines connected to the first conductive patterns 123G may include at least one conductive line connected to a ground pad 160G and at least one conductive line connected to a power pad 160P. When viewed in a plan view, each of the first conductive patterns 123G may be spaced apart from or may overlap a corresponding first conductive line among the first conductive lines 123L. A first conductive pattern 123G that is spaced apart from a corresponding first conductive line may be connected to the corresponding first conductive using an auxiliary conductive line 123L-A.

The first conductive lines 123L electrically connected to the first conductive patterns 123G may be connected to the ground pad 160G or the power pad 160P of the pads 160. The first conductive patterns 123G electrically connected to the ground pad 160G or the power pad 160P may be exposed through first openings 133OP1 of the first insulating layer 133 to contact the first capping layer 153. In some embodiments, each of the first conductive patterns 123G may be exposed by a corresponding first opening of the first openings 133OP1, and may have a larger width or a larger region than that of the corresponding first opening. In some embodiments, the first capping layer 153 may be connected to the first conductive lines 123L that are electrically connected to the ground pad 160G or the power pad 160P via the first conductive patterns 123G. The first conductive patterns 123G that have larger areas than corresponding first conductive lines may facilitate connection between the first capping layer 153 and the corresponding first conductive lines. The term "contact," as used herein, refers to a direct connection (i.e., touching) unless the context indicates otherwise.

Referring to FIGS. 2 and 3, the second conductive structure 126 may be a plate-shaped conductive pattern covering the second surface S2 of the base film 110. The second conductive structure 126 may be electrically connected to the first conductive patterns 123G of the first conductive structure 123 through the via 129 passing through the base film 110. One surface of the second conductive structure 126 may contact the second surface S2 of the base film 110, and the other surface of the second conductive structure 126 may contact the second capping layer 156. In example embodiments, the second conductive structure 126 may not include a wiring transmitting a signal.

The bumps BS of the semiconductor package 10 may connect the semiconductor chip 100 to the first conductive lines 123L of the first conductive structure 123. The semiconductor chip 100 may be mounted on the base film 110 through a flip chip bonding process. The bumps BS may include or may be, for example, solder balls provided on an active surface of the semiconductor chip 100. The bumps BS may be provided on the active surface of the semiconductor chip 100 to be physically and electrically coupled to the first conductive lines 123L on the base film 110.

The bumps BS may include conductive bumps serving as input terminals, and conductive bumps serving as output terminals. Through the bumps BS, the semiconductor chip 100 may receive at least one of a control signal, a power signal, and a ground signal for an operation of the semiconductor chip 100 from the outside through the bumps BS, may receive a data signal to be stored in the semiconductor chip 100 from the outside, or may provide data stored in the semiconductor chip 100 to the outside.

The first insulating layer 133 may be disposed on the first surface S1 of the base film 110. The first insulating layer 133 may prevent an unintended connection between the first conductive structures 123 and may protect the first conductive structures 123 from external physical and/or chemical damage.

The first insulating layer 133 may include a plurality of openings 133OP1 and 133OP2. A portion of the openings 133OP1 may expose the first conductive patterns 123G, and a portion of the openings 133OP2 may expose a region in which the semiconductor chip 100 is mounted, thereby exposing end portions of the first conductive lines 123L. The first insulating layer 133 may cover the first conductive structure 123 in a region excluding the first conductive patterns 123G connected to the semiconductor chip 100 and a mounting region of the semiconductor chip 100.

The first capping layer 153 and the second capping layer 156 may be disposed on the first surface S1 and the second surface S2 of the base film 110, respectively. The first capping layer 153 may cover the first insulating layer 133 and may contact the first conductive patterns 123G exposed by the opening 133OP1 of the first insulating layer 133. The first capping layer 153 may cap the semiconductor chip 100. Referring to FIG. 3, the first capping layer 153 may include a first portion 153a contacting the first conductive patterns 123G and the first insulating layer 133 on the first surface S1 of the base film 110, a second portion 153b disposed on an upper surface of the semiconductor chip 100, and a third portion 153c disposed between the first portion 153a and the second portion 153b. In some embodiments, the third portion 153c may connect the first portion 153a to the second portion 153b. The third portion 153c may be spaced apart from the side surface of the semiconductor chip 100 and may have an oblique shape. However, the shape of the first capping layer 153 is not limited thereto.

The second capping layer 156 may be disposed on the second surface S2 of the base film 110 to cover a lower surface of the second conductive structure 126. In example embodiments, the second capping layer 156 may cover the entire lower surface of the second conductive structure 126 and cover a side surface of the second conductive structure 126. The second capping layer 156 may have a width greater than a width of the second conductive structure 126 in an X-direction and a Y-direction.

The first capping layer 153 and the second capping layer 156 may be formed of a rigid material having conductivity. In some embodiments, each of the first capping layer 153 and the second capping layer 156 may include or may be a conductive layer including metal. The first capping layer 153 and the second capping layer 156 may include or may be formed of, for example, copper (Cu), aluminum (Al), silver (Ag), gold (Au), nickel (Ni), tin (Sn), or zinc (Zn), chromium (Cr), manganese (Mn), indium (Id), palladium (Pd), titanium (Ti), molybdenum (Mo), or platinum (Pt). In example embodiments, the first capping layer 153 and the second capping layer 156 may be formed of at least one of aluminum (Al) and copper (Cu).

The semiconductor package 10 may include a first capping layer 153 (i.e., a first conductive layer) and a second capping layer 156 (i.e., a second conductive layer) on opposite surfaces of the base film 110, respectively, so that electrical characteristics and heat dissipation characteristics may be improved. For example, the first and second capping layers 153 and 156 may be in contact with the first and second conductive structures 123 and 126, respectively, and the wiring lines electrically connected to the first and second capping layers 153 and 156 may be electrically connected to the ground pad 160G or the power pad 160P. By electrically connecting the first and second capping layers 153 and 156 formed of a conductive material to the ground pad 160G or the power pad 160P, EMI may be shielded on opposite surfaces of the base film 110. When the second conductive structure 126 is electrically connected to the ground pad 160G, electrostatic discharge (ESD) characteristics may be improved due to a contact region between the second conductive structure 126 and the second capping layer 156, and a return path may be secured to improve signal integrity (SI). At the same time, the first and second capping layers 153 and 156 may absorb and release heat generated by the semiconductor chip 100, and the like, so that the heat dissipation characteristics of the semiconductor package 10 may be improved. In some embodiments, the ground pad 160G may include at least one ground pad, and the power pad 160P may include at least one power pad.

Semiconductor packages according to example embodiments will be described with reference to FIGS. 4 to 7. In the embodiments of FIGS. 4 to 7, the same reference numerals as those of FIGS. 1 to 3 indicate corresponding components, and a redundant description will be omitted. In the embodiments of FIGS. 4 to 7, components having the same reference numerals as those of FIGS. 1 to 3 but different alphabets are used to describe an embodiment different from that of FIGS. 1 to 3 but these components may have features that are the same as or similar to those described above with reference to the same reference numerals.

A semiconductor package 10a according to example embodiments will be described with reference to FIGS. 4 and 5.

Figure 4:
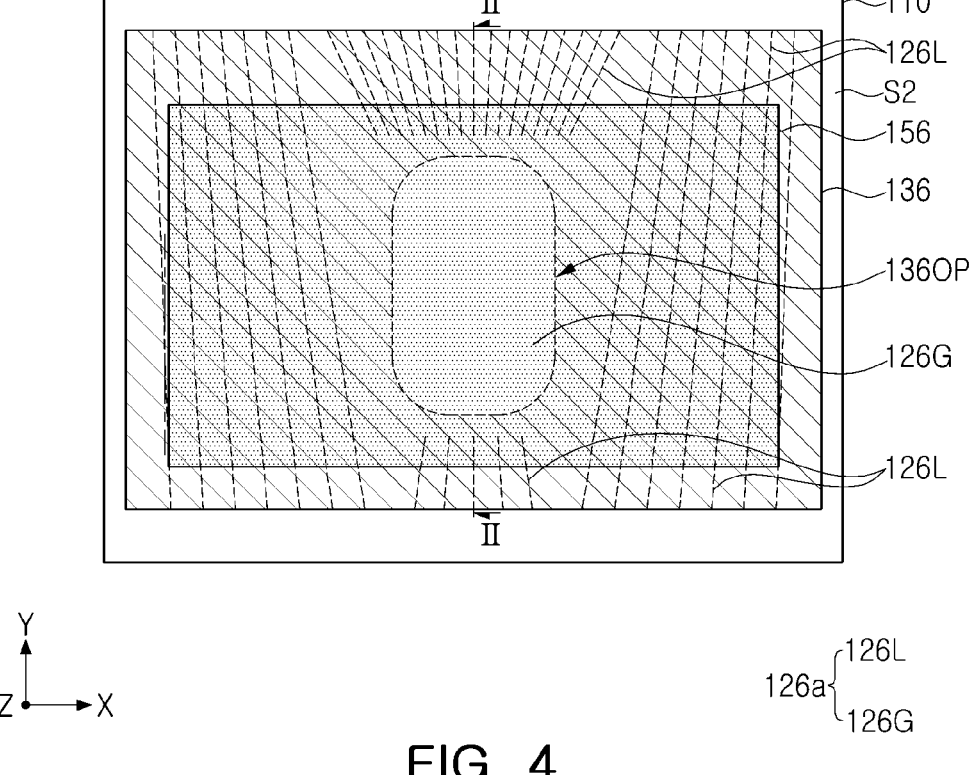
FIG. 4 is a schematic bottom layout view of a semiconductor package according to example embodiments.
Figure 5:
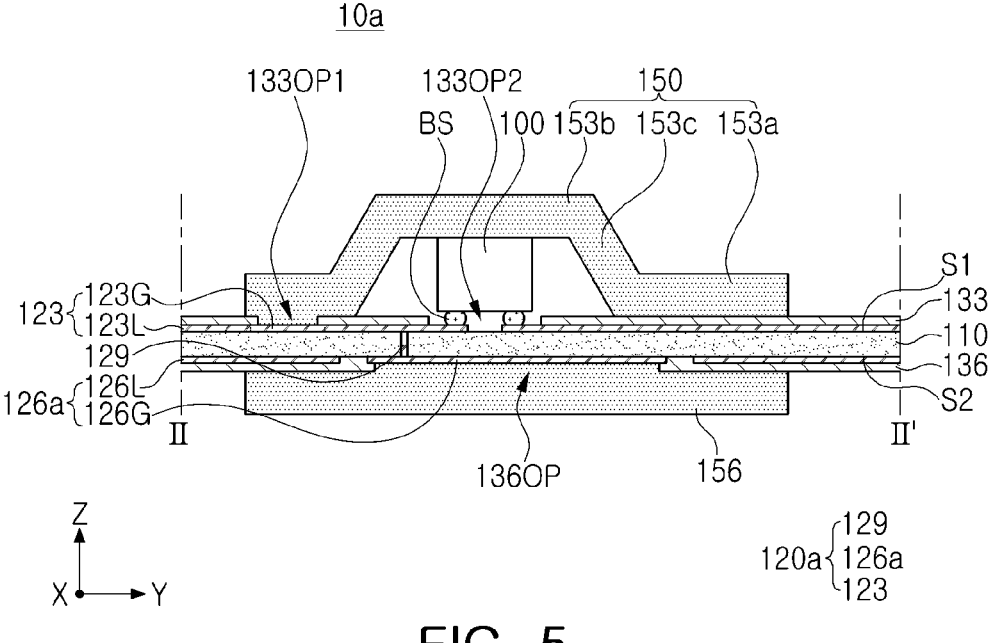
FIG. 5 is a schematic cross-sectional view of a semiconductor package according to example embodiments.

FIG. 4 is a schematic bottom layout view of a semiconductor package 10a according to example embodiments, and FIG. 5 is a schematic cross-sectional view of the semiconductor package 10a according to example embodiments. FIG. 5 is a cross-sectional view taken along line II-II' of FIG. 4 and an upper layout view of the semiconductor package 10a may be the same as or similar to that of FIG. 1.

Referring to FIGS. 1, 4, and 5, the semiconductor package 10a is different from the semiconductor package 10 in the shape of a second conductive structure 126a and in that the semiconductor package 10a further includes a second insulating layer 136.

The semiconductor package 10a may include a second conductive structure 126a disposed on the second surface S2 of the base film 110. The second conductive structure 126a may include second conductive lines 126L and a second conductive pattern 126G. In example embodiments, the second conductive lines 126L may include wirings for transmitting signals, and may be electrically connected to the pads (160 of FIG. 1), for example, the signal pads (160S of FIG. 1). The second conductive pattern 126G may be electrically connected to the first conductive structure 123 through the via 129. The first conductive line 123L and the first conductive pattern 123G electrically connected to the second conductive pattern 126G may be connected to the ground pad (160G in FIG. 1) or the power pad (160P in FIG. 1). In example embodiments, the second conductive lines 126L and the second conductive pattern 126G may be spaced apart from each other. The first conductive structure 123, the second conductive structure 126a, and the via 129 may constitute the conductive structure 120a of the semiconductor package 10a.

The semiconductor package 10a may include a second insulating layer 136 covering the second conductive structure 126a. The second insulating layer 136 may further include a second opening 136OP. The second insulating layer 136 may cover the second conductive lines 126L, and the second opening 136OP may expose the second conductive pattern 126G. The second conductive pattern 126G exposed by the second opening 136OP may contact the second capping layer 156.

Figure 6:
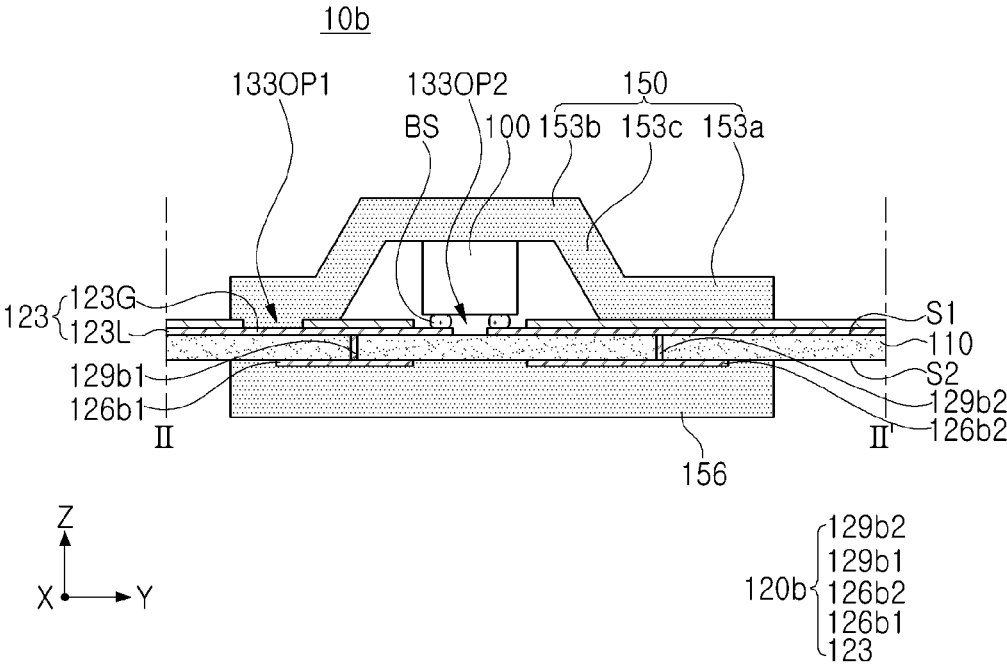
FIG. 6 is a schematic cross-sectional view of a semiconductor package according to example embodiments.

A semiconductor package 10b according to example embodiments will be described with reference to FIG. 6. FIG. 6 shows a cross-section corresponding to FIG. 3.

Referring to FIG. 6, the semiconductor package 10b is different from the semiconductor package 10 of FIGS. 1 to 3 in the shape of the second conductive structure and the number of vias.

The second conductive structure may include a plurality of conductive patterns 126b1 and 126b2 spaced apart from each other. In example embodiments, the second conductive structure may include two conductive patterns 126b1 and 126b2. The semiconductor package 10b may include a plurality of vias 129b1 and 129b2 connecting the respective conductive patterns 126b1 and 126b2 to the first conductive lines 123L. The first conductive lines 123L electrically connected to the conductive patterns 126b1 and 126b2 may be electrically connected to a ground pad or a power pad.

Figure 7:
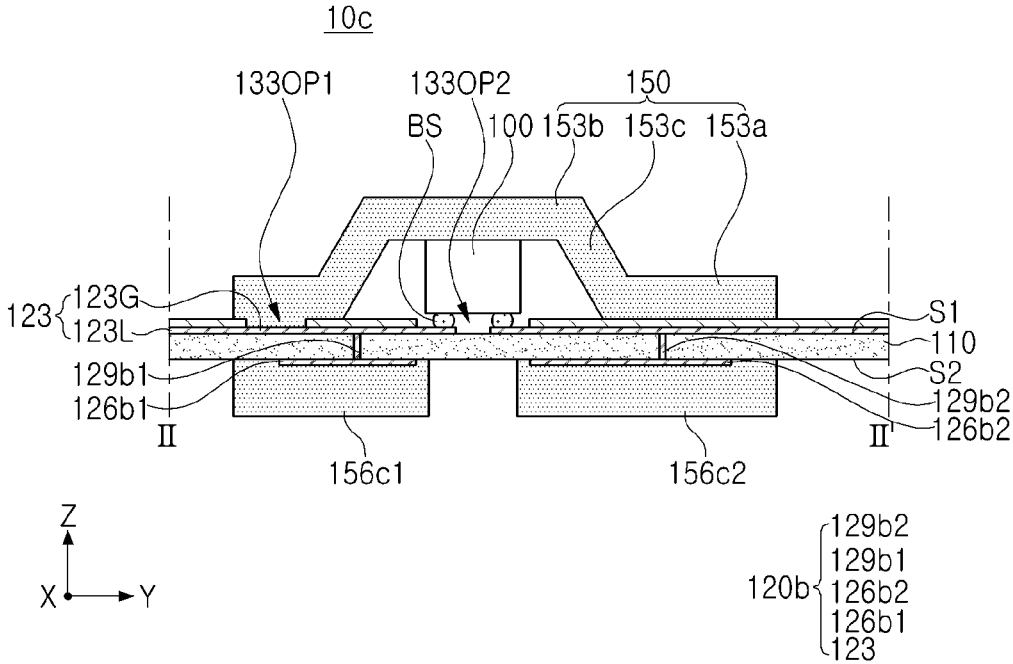
FIG. 7 is a schematic cross-sectional view of a semiconductor package according to example embodiments.

A semiconductor package 10c according to example embodiments will be described with reference to FIG. 7. FIG. 7 shows a cross-section corresponding to FIG. 6. In the embodiments of FIG. 7, the same reference numerals as those of FIG. 6 indicate corresponding components, and a redundant description thereof will be omitted.

Referring to FIG. 7, the semiconductor package 10c is different from the semiconductor package 10b of FIG. 6 in the shape of the second capping layer. The second capping layer may include a plurality of portions. For example, the second capping layer may include a plurality of capping patterns 156c1 and 156c2, spaced apart from each other, respectively, covering the plurality of conductive patterns 126b1 and 126b2 spaced apart from each other. The first capping pattern 156c1 and the second capping pattern 156c2 may be spaced apart from each other. A surface of the base film 110 may be partially exposed between the first capping pattern 156c1 and the second capping pattern 156c2.

Figure 8:
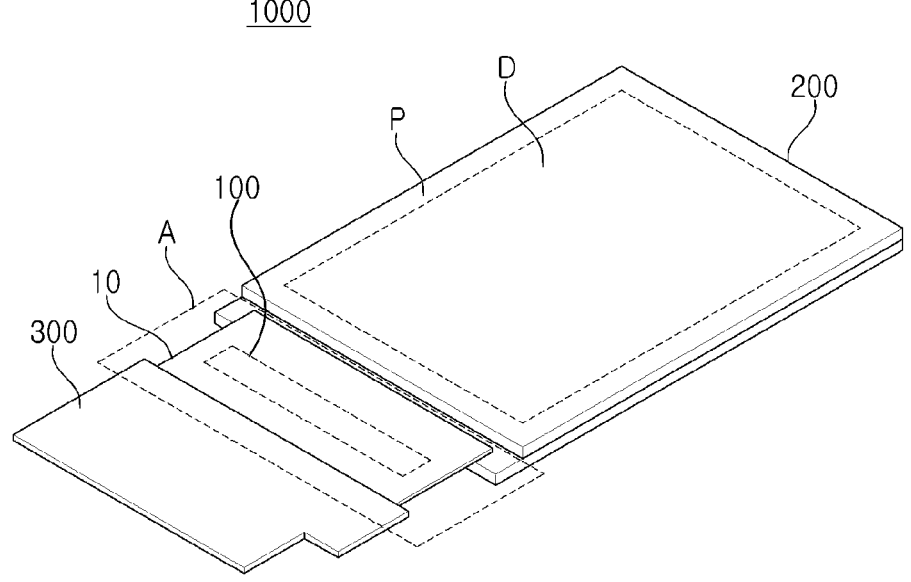
FIG. 8 is a schematic perspective view of a display apparatus according to example embodiments.

FIG. 8 is a schematic perspective view of a display apparatus according to example embodiments.

Referring to FIG. 8, the display apparatus 1000 may include a display panel 200, a printed circuit board (PCB) 300, and a semiconductor package 10.

The display panel 200 may include a liquid crystal display panel or an organic light emitting display panel. The display panel 200 may include a display region D displaying an image and a peripheral region P applying a driving signal to the display region D. Although not specifically illustrated in FIG. 8, the display panel 200 may include an upper panel, a lower panel, an organic light emitting structure or a liquid crystal structure formed between the upper panel and the lower panel, a plurality of gate lines, and a plurality of data lines. The upper panel and the lower panel may each include a glass substrate, a quartz substrate, a transparent plastic substrate, or the like. For example, the display panel 200 may include a transparent plastic substrate. The display panel 200 including a transparent plastic substrate may be a flexible substrate.

The PCB 300 may include, for example, a flexible printed circuit board (FPCB). The PCB 300 may receive various signals from the outside and output the received signals to the semiconductor package 10.

The semiconductor package 10 may process various signals input from the PCB 300 and output a driving signal for driving the display panel 200. To this end, a first side of the semiconductor package 10 may be attached to the display panel 200, and a second side thereof may be attached to the PCB 300. The semiconductor package as described above with reference to FIGS. 1 to 7 may be applied to the display apparatus 1000.

Figure 9A:
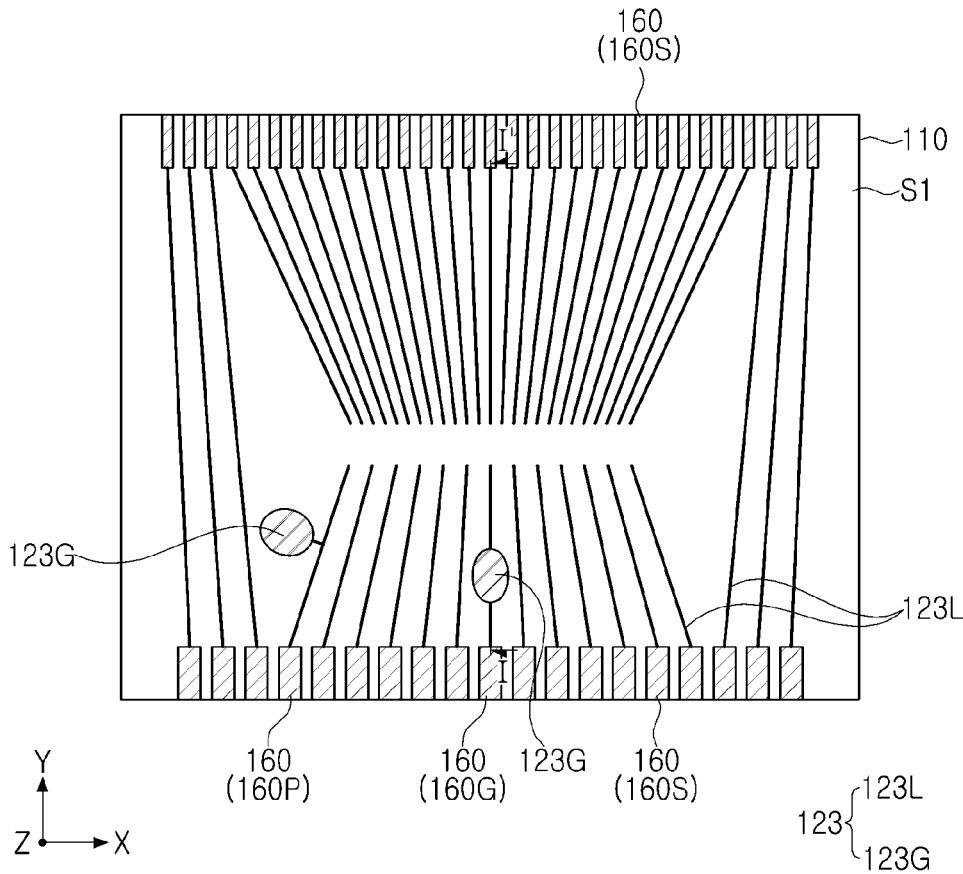
FIGS. 9A to 9C, 10A, 10B, 11A, and 11B are schematic views illustrating a manufacturing process of a semiconductor package according to example embodiments.

A process of manufacturing a semiconductor package will be described with reference to FIGS. 9A to 9C, 10A, 10B, 11A, and 11B. FIGS. 9A to 11B illustrate a manufacturing process of the semiconductor package 10 of FIGS. 1 to 3. FIGS. 9A, 10A and 11A illustrate a top layout view corresponding to FIG. 1, FIG. 9B shows a bottom layout view corresponding to FIG. 2, and FIGS. 9C, 10B, and 11B illustrate cross-sections corresponding to FIG. 3.

Figure 9B:
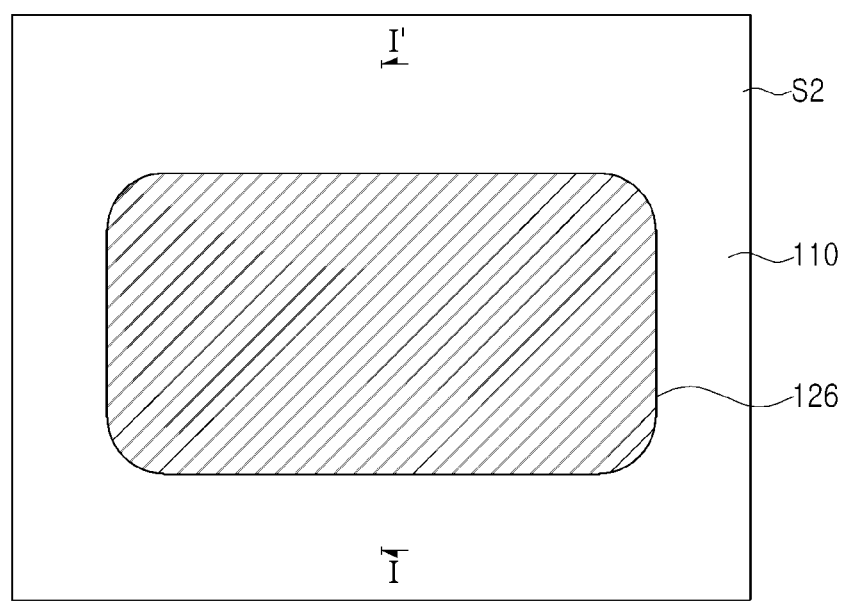
Figure 9B:
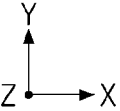
Figure 9C:
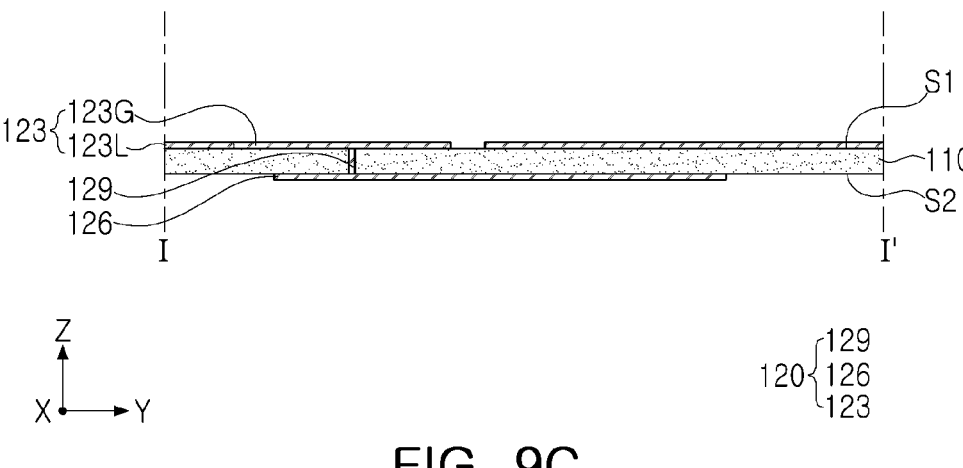
Figure 10A:
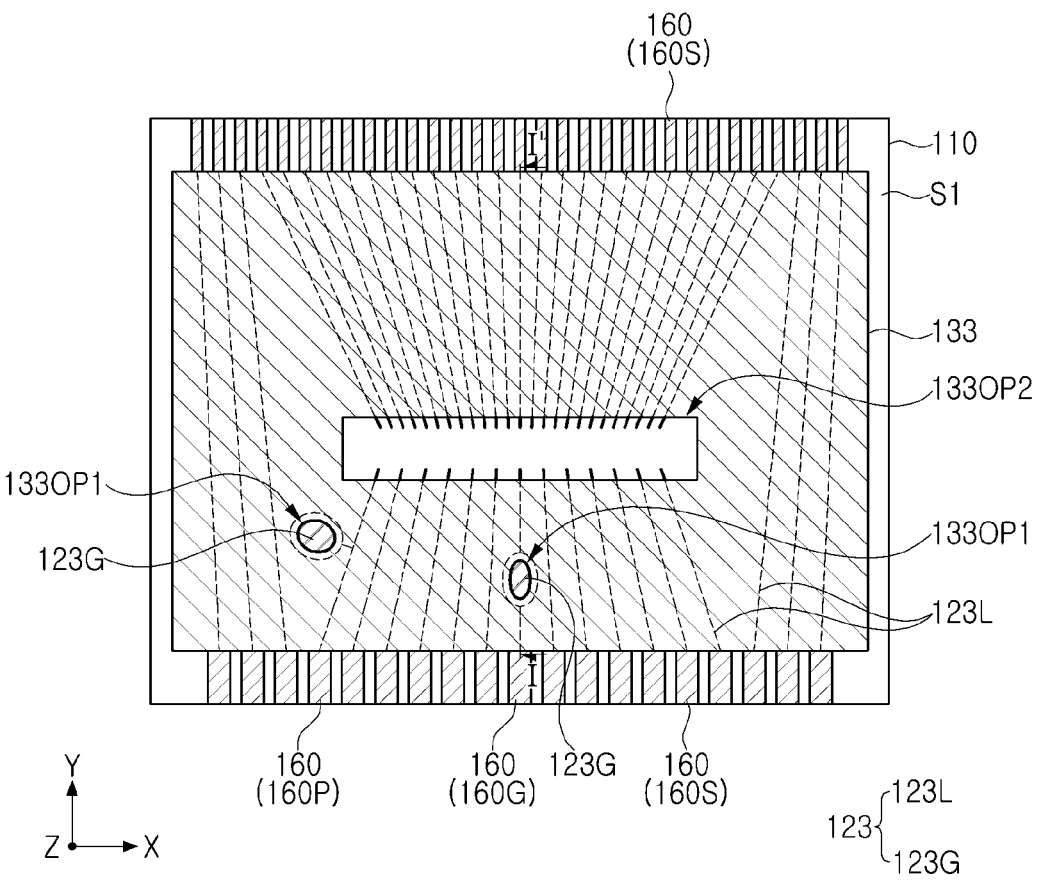

Referring to FIGS. 9A to 9C, the conductive structure 120 may be formed on the base film 110.

Forming the conductive structure 120 on the base film 110 may include forming the via 129, and forming the first conductive structure 123 electrically connected to the via 129 on the first surface S1 of the base film 110, and the second conductive structure 126 electrically connected to the via 129 on the second surface S2 of the base film 110. Forming the via 129 may include, for example, forming a via hole passing through the base film 110 and then filling the via hole with a conductive material. Forming the first conductive structure 123 and the second conductive structure 126 may include, for example, forming a pattern on the first surface S1 and the second surface S2 of the base film 110 using a photoresist dry film and then filling the pattern with a plating method or the like. However, the method of forming the first and second conductive structures 123 and 126 is not limited thereto. In other embodiments, the first and second conductive structures 123 and 126 may be formed by etching a copper layer in a two-layer flexible copper clad layer (FCCL).

Referring to FIGS. 9A and 9C, the first conductive structure 123 may include a plurality of first conductive lines 123L and first conductive patterns 123G extending from some of the first conductive lines 123L. The first conductive patterns 123G may be formed to extend from the first conductive lines 123L connected to the ground pad 160G or the power pad 160P, among the pads 160 formed on the base film 110.

Referring to FIGS. 9B and 9C, the second conductive structure 126 may be formed in a plate-shaped conductive pattern. The second conductive structure 126 may be formed to be electrically connected to the first conductive patterns 123G of the first conductive structure 123 through the via 129.

Figure 10B:
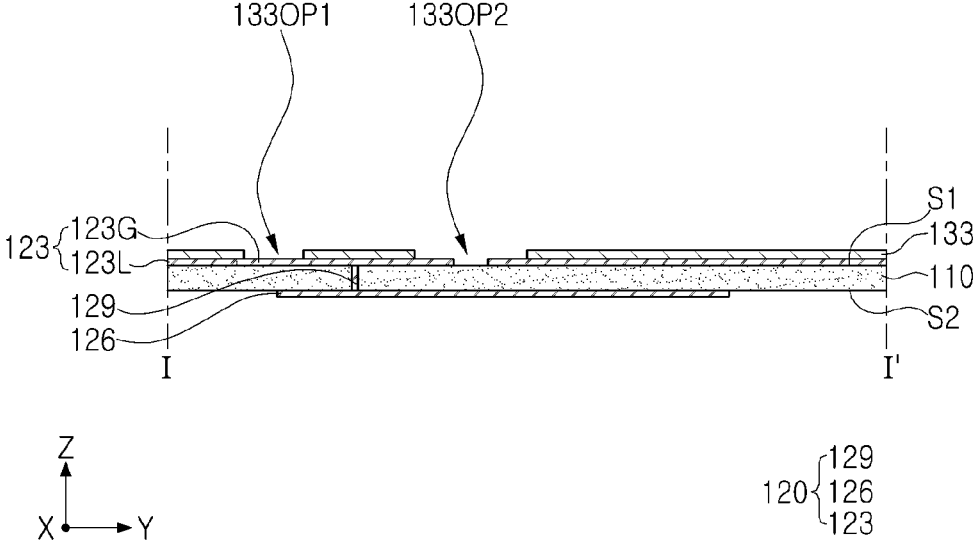
Figure 11A:
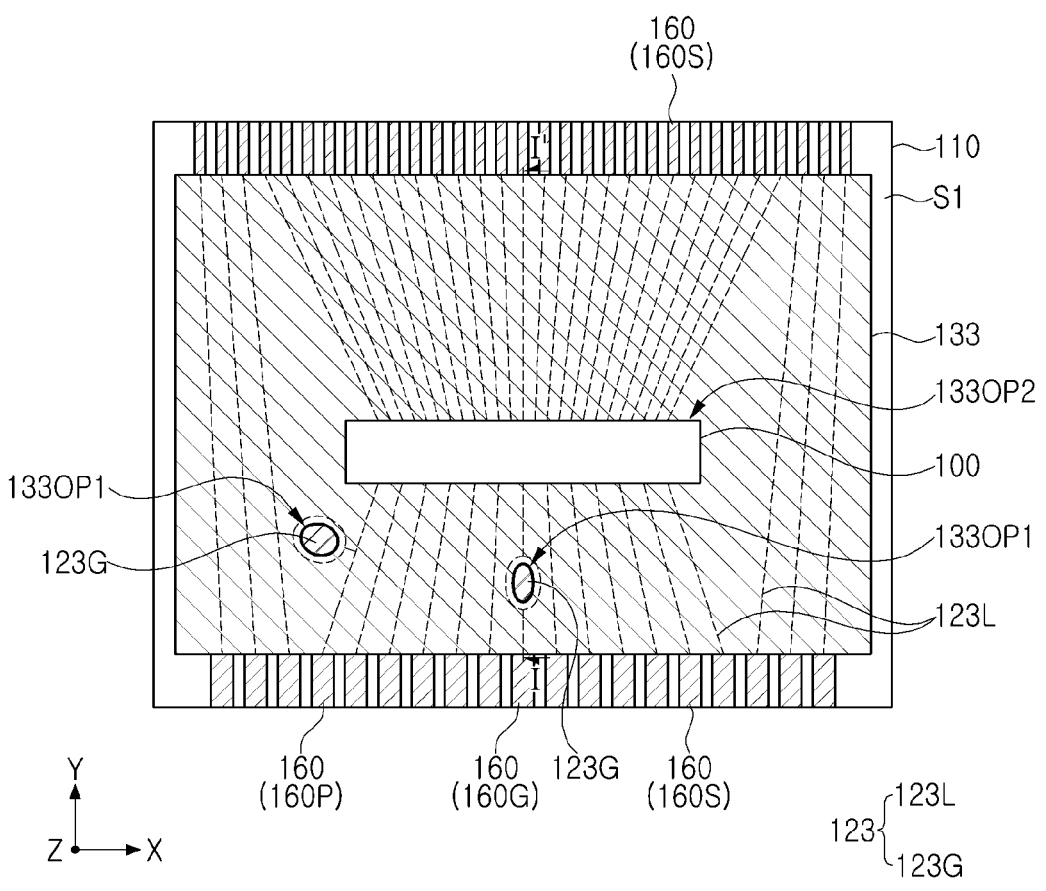

Referring to FIGS. 10A and 10B, the first insulating layer 133 may be formed on the first surface S1 of the base film 110.

The first insulating layer 133 may be formed to cover the first conductive structure 123 on the first surface S1 of the base film 110. The first insulating layer 133 may be formed by applying a paste, such as solder resist, to cover the base film 110 and the first conductive structure 123. The paste may be applied to cover the first conductive structure 123, while exposing the pads 160 formed on the first surface S1 of the base film 110. The paste may be applied to a region other than the first conductive patterns 123G and the mounting region of the semiconductor chip (100 of FIG. 1). Accordingly, the first insulating layer 133 including the openings 133OP1 and 133OP2 may be formed. The first conductive patterns 123G may be exposed through the openings 133OP1, and end portions of the first conductive lines 123L disposed in the chip mounting region may be exposed through the openings 133OP2.

Figure 11B:
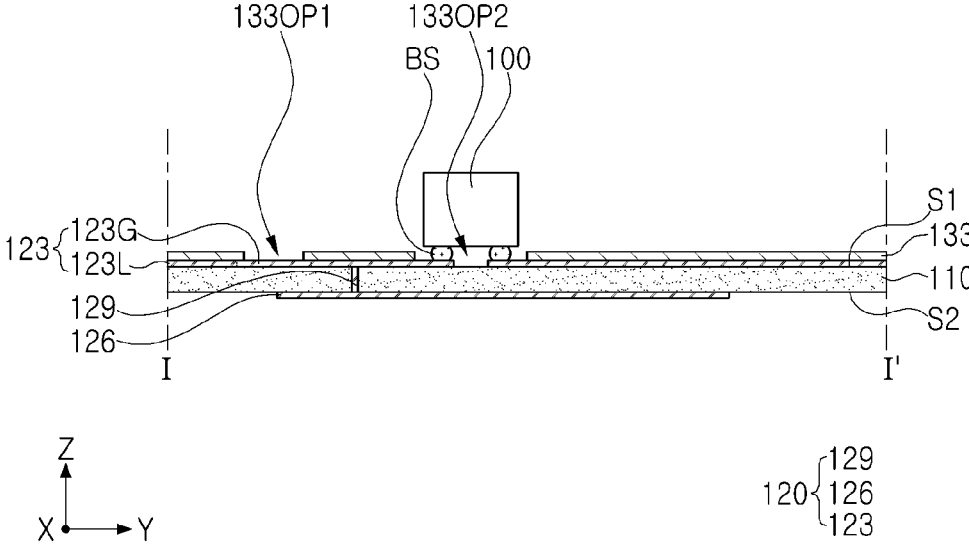

Referring to FIGS. 11A and 11B, the semiconductor chip 100 may be mounted on the first surface S1 of the base film 110.

The semiconductor chip 100 may be electrically connected to the first conductive lines 123L exposed by the opening 133OP2 of the first insulating layer 133. The semiconductor chip 100 may be electrically connected to the first conductive lines 123L by, for example, the bumps BS formed between the exposed end portions of the first conductive lines 123L and the semiconductor chip 100.

Referring back to FIGS. 1 to 3 together, the first capping layer 153 may be formed on the first surface S1 of the base film 110, and the second capping layer 156 may be formed on the second surface S2 of the base film 110.

The first capping layer 153 may be formed to cover the first conductive structure 123 and the semiconductor chip 100 on the first surface S1 of the base film 110. The first capping layer 153 may contact the first conductive patterns 123G of the first conductive structure 123 exposed by the openings 133OP1 of the first insulating layer 133. In example embodiments, the first capping layer 153 may be formed by attaching a conductive structure to the first surface S1 of the base film 110. In example embodiments, the conductive structure may be a metal tape having adhesive force. The first capping layer 153 includes a first portion 153a (i.e., a first conductive portion) contacting the first conductive patterns 123G and covering the first insulating layer 133, a second portion 153b (i.e., a second conductive portion), and a third portion 153c (i.e., a third conductive portion) capping the semiconductor chip 100. The second portion 153b may cap a top surface of the semiconductor chip 100 and may be located on a level higher than that of the first portion 153a. The third portion 153c may connect the first portion 153a to the second portion 153b. The first capping layer 153 may be formed of a rigid material.

The second capping layer 156 may be formed to cover the second conductive structure 126 on the second surface S2 of the base film 110. The second capping layer 156 may be formed to contact the surface of the second conductive structure 126. In example embodiments, the second capping layer 156 may be formed by attaching a metal tape on the second surface S2 of the base film 110. In some embodiments, the second portion 153b may be higher than the first portion 153a relative to the first surface S1 of the base film 110.

According to embodiments of the inventive concept, by providing a capping layer electrically connected to a ground pad or a power pad on the upper and lower surfaces of the base film, heat dissipation characteristics and electrical characteristics may be improved at the same time.

While example embodiments have been shown and described above, it will be apparent to those skilled in the art that modifications and variations could be made without departing from the scope of the present inventive concept as defined by the appended claims.

What is claimed is:

1. A semiconductor package comprising:
   a base film having a first surface and a second surface opposite each other;
   a first conductive structure disposed on the first surface of the base film;
   a second conductive structure disposed on the second surface of the base film;
   a via passing through the base film and connecting the first conductive structure to the second conductive structure;
   a semiconductor chip on the first surface of the base film and electrically connected to the first conductive structure;
   a first insulating layer covering the first conductive structure on the first surface of the base film and including a first opening exposing a first conductive pattern of the first conductive structure;
   a first conductive layer disposed on the first insulating layer and covering the first insulating layer and the semiconductor chip, wherein the first conductive layer directly contacts a region of the first conductive pattern exposed by the first opening; and
   a second conductive layer disposed on the second surface of the base film and covering the second conductive structure, wherein a portion of the second conductive layer directly contacts at least a portion of the second conductive structure.

2. The semiconductor package of claim 1, wherein each of the first conductive layer and the second conductive layer is formed of metal.

3. The semiconductor package of claim 2, wherein each of the first conductive layer and the second conductive layer includes at least one of aluminum (Al) and copper (Cu).

4. The semiconductor package of claim 1, further comprising:
   pads formed on the first surface of the base film and electrically connected to the first conductive structure, wherein the pads include at least one ground pad, at least one power pad, and signal pads, and
   wherein the first conductive pattern of the first conductive structure is electrically connected to the at least one power pad or the at least one ground pad.

5. The semiconductor package of claim 1, further comprising:
   a second insulating layer disposed between the second conductive structure and the second conductive layer and covering a portion of the second conductive structure,
   wherein the second insulating layer includes a second opening exposing a second conductive pattern of the second conductive structure.

6. The semiconductor package of claim 5, wherein the second conductive layer directly contacts a region of the second conductive pattern of the second conductive structure.

7. The semiconductor package of claim 5, wherein the second conductive pattern is electrically connected to the first conductive pattern by the via.

8. The semiconductor package of claim 1,
wherein the second conductive structure includes a plate-shaped second conductive pattern.

9. The semiconductor package of claim 8,
wherein the second conductive layer has an area larger than an area of the plate-shaped second conductive pattern.

10. The semiconductor package of claim 8,
wherein the plate-shaped second conductive pattern has one surface directly contacting the second surface of the base film and the other surface opposite the one surface, and
wherein the second conductive layer covers the entirety of the other surface of the plate-shaped second conductive pattern.

11. The semiconductor package of claim 1, further comprising:
a conductive bump disposed on the first conductive structure,
wherein the conductive bump connects the semiconductor chip to the first conductive structure.

12. The semiconductor package of claim 1,
wherein the first conductive layer includes:
a first conductive portion disposed on the first surface of the base film and directly contacting the first conductive pattern of the first conductive structure;
a second conductive portion covering an upper surface of the semiconductor chip; and
a third conductive portion connecting the first conductive portion to the second conductive portion, and
wherein the second conductive portion is higher than the first conductive portion relative to the first surface of the base film.

13. The semiconductor package of claim 12,
wherein the third conductive portion includes a portion spaced apart from a side surface of the semiconductor chip.

14. A semiconductor package comprising:
a base film having a first surface and a second surface opposing each other;
a first conductive structure disposed on the first surface of the base film and including first conductive lines and first conductive patterns extending from the first conductive lines, respectively;
a semiconductor chip mounted on the first surface of the base film and electrically connected to the first conductive lines;
a second conductive structure disposed on the second surface of the base film;
a via passing through the base film and electrically connecting the first conductive structure to the second conductive structure;
a first conductive layer disposed on the first conductive structure and directly contacting the first conductive patterns; and a second conductive layer disposed on the second conductive structure and directly contacting at least a portion of the second conductive structure.

15. The semiconductor package of claim 14,
wherein the second conductive structure includes a plurality of second conductive patterns spaced apart from each other.

16. The semiconductor package of claim 15,
wherein the second conductive layer includes a plurality of conductive patterns respectively covering the plurality of second conductive patterns and spaced apart from each other.

17. A semiconductor package comprising:
a base film having a first surface on which a semiconductor chip is mounted and a second surface opposite the first surface;
pads disposed on the first surface of the base film and including at least one ground pad, at least one power pad, and signal pads;
a first wiring line disposed on the first surface of the base film and including a first end portion electrically connected to the at least one ground pad or the at least one power pad and a second end portion electrically connected to the semiconductor chip;
a first conductive pattern extending from the first wiring line;
a first insulating layer covering the first wiring line and exposing the first conductive pattern;
a first conductive layer disposed on the first insulating layer and covering the semiconductor chip, wherein the first conductive layer directly contacts the first conductive pattern;
a second conductive pattern disposed on the second surface of the base film and electrically connected to the first conductive pattern; and
a second conductive layer directly contacting the second conductive pattern.

18. The semiconductor package of claim 17, further comprising:
a via passing through the base film,
wherein the first conductive pattern and the second conductive pattern are electrically connected through the via.

19. The semiconductor package of claim 17,
wherein the first conductive layer and the second conductive layer include at least one of aluminum (Al) and copper (Cu).

20. The semiconductor package of claim 17, further comprising:
second wiring lines disposed on the second surface of the base film,
wherein the second wiring lines are spaced apart from the second conductive pattern and electrically connected to the signal pads.

\* \* \* \* \*